United States Patent
Lee

(10) Patent No.: US 10,743,423 B2
(45) Date of Patent: Aug. 11, 2020

(54) MANUFACTURING METHOD OF COMPOSITE SUBSTRATE

(71) Applicant: AZOTEK CO., LTD., Taoyuan (TW)

(72) Inventor: Hung-Jung Lee, Taoyuan (TW)

(73) Assignee: AZOTEK CO., LTD., Taoyuan (TW)

( * ) Notice: Subject to any disclaimer, the term of this patent is extended or adjusted under 35 U.S.C. 154(b) by 285 days.

(21) Appl. No.: 15/940,988

(22) Filed: Mar. 30, 2018

(65) Prior Publication Data

US 2019/0090360 A1 Mar. 21, 2019

Related U.S. Application Data

(60) Provisional application No. 62/558,874, filed on Sep. 15, 2017.

(51) Int. Cl.
| | |
|---|---|
| *H05K 3/46* | (2006.01) |
| *H05K 3/40* | (2006.01) |
| *H05K 1/02* | (2006.01) |
| *H05K 1/03* | (2006.01) |
| *H05K 1/11* | (2006.01) |
| *H05K 3/06* | (2006.01) |

(52) U.S. Cl.
CPC ........... *H05K 3/4644* (2013.01); *H05K 1/024* (2013.01); *H05K 1/032* (2013.01); *H05K 1/113* (2013.01); *H05K 3/4007* (2013.01); *H05K 3/4038* (2013.01); *H05K 3/4647* (2013.01); *H05K 3/061* (2013.01); *H05K 2201/0141* (2013.01); *H05K 2201/0145* (2013.01); *H05K 2201/0341* (2013.01); *H05K 2203/025* (2013.01); *H05K 2203/0759* (2013.01); *H05K 2203/0783* (2013.01)

(58) Field of Classification Search
CPC . G02B 5/1847; G02B 5/1857; G02F 1/13334; G02F 1/1347; G09G 3/34; G09G 3/36; H05K 1/024; H05K 1/032; H05K 1/113; H05K 3/081; H05K 3/4007; H05K 3/4038; H05K 3/4644; H05K 3/4647; H05K 2201/0341; H05K 2201/0145; H05K 2203/025; H05K 2203/0759; H05K 2203/0783

See application file for complete search history.

(56) References Cited

U.S. PATENT DOCUMENTS 5,625,474 A * 4/1997 Aomori ................. G02F 1/1347
349/139
5,959,708 A * 9/1999 Lee ..................... G02F 1/134363
349/122

(Continued)

FOREIGN PATENT DOCUMENTS

| CN | 101470278 A | 7/2009 |
| CN | 102342186 A | 2/2012 |

(Continued)

*Primary Examiner* — Carl J Arbes
(74) *Attorney, Agent, or Firm* — CKC & Partners Co., LLC

(57) ABSTRACT

A manufacturing method of a composite substrate is provided. A first conductive layer is formed on a first liquid crystal polymer layer. The first conductive layer is patterned to form a patterned first conductive layer. A second liquid crystal polymer layer including a soluble liquid crystal polymer is formed to cover the patterned first conductive layer. The second liquid crystal polymer layer which is on the patterned first conductive layer is removed.

13 Claims, 9 Drawing Sheets

(56) References Cited

U.S. PATENT DOCUMENTS

| | | |
|---|---|---|
| 6,994,896 B2 | 2/2006 | Sethumadhavan et al. |
| 7,387,858 B2 * | 6/2008 | Chari .................... G02F 1/1334 252/299.01 |
| 8,711,300 B2 * | 4/2014 | Yamamoto ........... G02B 5/3016 349/122 |
| 2003/0178227 A1 | 9/2003 | Matsunaga et al. |
| 2009/0111949 A1 | 4/2009 | Cho et al. |
| 2010/0326696 A1 | 12/2010 | Mahapatra |
| 2011/0256363 A1 | 10/2011 | Satou |
| 2014/0087165 A1 | 3/2014 | Nair et al. |

FOREIGN PATENT DOCUMENTS

| | | |
|---|---|---|
| CN | 103917582 A | 7/2014 |
| JP | 05-090740 | 4/1993 |
| JP | 08-097565 A | 4/1996 |
| JP | 2001274554 | 10/2001 |
| JP | 2001284801 | 10/2001 |
| JP | 2006-8976 A | 1/2006 |
| JP | 2006-282678 A | 10/2006 |
| JP | 2007070418 | 3/2007 |
| JP | 2007081433 | 3/2007 |
| JP | 2007-161835 A | 6/2007 |
| JP | 2007235167 | 9/2007 |
| JP | 2007-253366 A | 10/2007 |
| JP | 2008-37982 A | 2/2008 |
| JP | 2009246200 A | 10/2009 |
| JP | 2010-168410 | 8/2010 |
| JP | 2010-532567 A | 10/2010 |
| JP | 2011-32316 A | 2/2011 |
| JP | 2011080170 | 4/2011 |
| JP | 2011-134884 A | 7/2011 |
| JP | 3208028 B2 * | 9/2011 |
| JP | 2012-033869 A | 2/2012 |
| JP | 2012046742 A | 3/2012 |
| JP | 2012242442 A * | 12/2012 |
| JP | 2012242622 A * | 12/2012 |
| JP | 2014-120580 A | 6/2014 |
| JP | 2014120580 A | 6/2014 |
| JP | 2014533325 A | 12/2014 |
| JP | 2015183159 A | 10/2015 |
| JP | 2016062954 A | 4/2016 |
| JP | 2017075339 A | 4/2017 |
| KR | 1020120001623 A | 1/2012 |
| WO | 2004070694 A2 * | 8/2004 |
| WO | 2011018837 A1 | 2/2011 |
| WO | 2013065453 A1 | 5/2013 |
| WO | 2014147903 A1 | 9/2014 |
| WO | 2015050080 A1 | 4/2015 |
| WO | 2018056294 A1 | 3/2018 |
| WO | 2018101214 A1 | 6/2018 |

* cited by examiner

US 10,743,423 B2

MANUFACTURING METHOD OF COMPOSITE SUBSTRATE

CROSS-REFERENCE TO RELATED APPLICATION

This application claims priority to U.S. Provisional Application Ser. No. 62/558,874, filed Sep. 15, 2017, which is herein incorporated by reference.

BACKGROUND

Field of Invention

The present invention relates to a manufacturing method of a composite substrate. More particularly, the present invention relates to a method of manufacturing a composite substrate by using a liquid crystal polymer layer including a soluble liquid crystal polymer.

Description of Related Art

Generally, during manufacturing processes of substrates (e.g., high frequency substrates), it is usually involved operations of drilling holes and then filling the holes with conductive materials to form conductive paths. However, the above operations are complex, and thus cannot satisfy the structural design having more conductive paths or higher density of conductive paths.

In view of the descriptions above, it is necessary to provide a novel method of manufacturing a substrate.

SUMMARY

The present disclosure provides a manufacturing method of a composite substrate. The manufacturing method includes forming a first conductive layer on a first liquid crystal polymer layer; patterning the first conductive layer to form a patterned first conductive layer; forming a second liquid crystal polymer layer comprising a soluble liquid crystal polymer to cover the patterned first conductive layer; removing the second liquid crystal polymer layer which is on the patterned first conductive layer.

In some embodiments, forming the second liquid crystal polymer layer to cover the patterned first conductive layer includes coating a mixture including the soluble liquid crystal polymer and a solvent on the first liquid crystal polymer layer; removing the solvent to form the second liquid crystal polymer layer.

In some embodiments, the soluble liquid crystal polymer includes a repeating unit represented by a formula shown below:

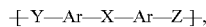

wherein Ar is 1,4-phenylene, 1,3-phenylene, 2,6-naphthalene, or 4,4'-biphenylene; Y is —O— or —NH—; Z is —C=O—; and X is amino group, carboxamido group, imido/imino group, amidino group, aminocarbonylamino group, aminothiocarbonyl group, aminocarbonyloxy group, aminosulfonyl group, aminosulfonyloxy group, aminosulfonylamino group, carboxyl ester group, (carboxyl ester) amino group, (alkoxycarbonyl)oxy group, alkoxycarbonyl group, hydroxyamino group, alkoxyamino group, cyanato group, isocyanato group, or a combination thereof.

In some embodiments, the soluble liquid crystal polymer is a liquid crystal aromatic polyester.

In some embodiments, after removing the second liquid crystal polymer layer which is on the patterned first conductive layer, the manufacturing method further includes forming a second conductive layer on the patterned first conductive layer.

In some embodiments, before forming the second conductive layer on the patterned first conductive layer, the manufacturing method further includes forming a bonding structure in direct contact with the patterned first conductive layer.

In some embodiments, a material of the bonding structure includes a solder or an anisotropic conductive material.

In some embodiments, before patterning the first conductive layer to form the patterned first conductive layer, the manufacturing method further includes forming a bonding layer on the first conductive layer.

In some embodiments, a material of the bonding layer includes a solder or an anisotropic conductive material.

In some embodiments, before forming the second conductive layer on the patterned first conductive layer, the manufacturing method further includes forming a bonding layer on the patterned first conductive layer.

In some embodiments, after forming the second conductive layer on the patterned first conductive layer, the manufacturing method further includes patterning the second conductive layer and the bonding layer.

In some embodiments, a material of the bonding layer includes a solder or an anisotropic conductive material.

In some embodiments, patterning the first conductive layer to form the patterned first conductive layer includes patterning the first conductive layer to form a conductive wire and a conductive pillar thicker than the conductive wire.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
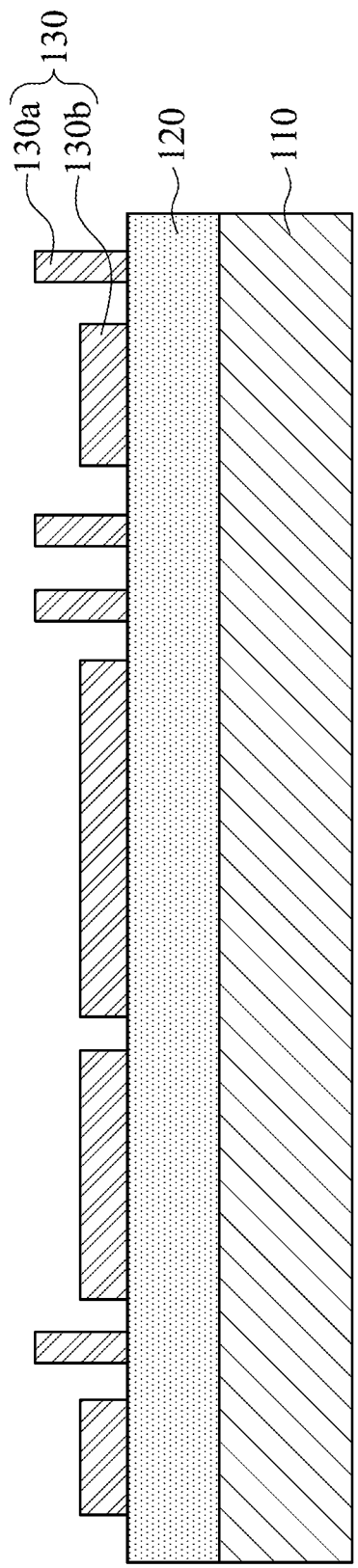
FIGS. 1A-1G are cross-sectional views of a composite substrate at various stages of fabrication according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Further-more, for simplifying the drawings, some of the conventional structures and elements are shown with schematic illustrations.

The present disclosure provides a manufacturing method of a composite substrate. FIGS. 1A-1G are cross-sectional views of a composite substrate at various stages of fabrication according to one embodiment of the present disclosure.

Please refer to FIG. 1A. A first conductive layer 120 is formed on a first liquid crystal polymer layer 110, and a resist 130 is formed on the first conductive layer 120. For example, a material of the first liquid crystal polymer layer 110 is selected from, but not limited to, one or more of aromatic polyesters, aromatic polyamides, poly-p-phenylene terephthalamide, poly(p-phenylene benzobisoxazole), and a copolymer of p-hydroxybenzoic acid and 6-hydroxy-2-naphthoic acid. In some embodiments, a material of the first conductive layer 120 includes copper, aluminum, iron, silver, palladium, nickel, chromium, molybdenum, tungsten, zinc, manganese, cobalt, gold, tin, lead, stainless steel, or an alloy of the above metals. For example, the first conductive layer 120 may be a metal foil, such as copper foil, aluminum foil, silver foil, tin foil or/and gold foil. The resist 130 includes resists 130a and resists 130b. The resists 130a are thicker than the resists 130b. In some embodiments, the resist 130 can be formed by a gray scale mask. For example, the gray scale mask is a half-tone mask or a gray-tone mask.

Figure 1B:
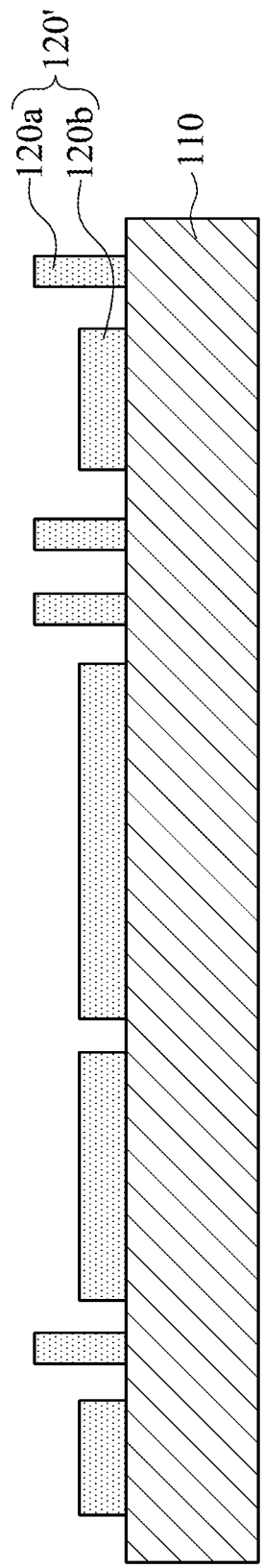

Please refer to FIG. 1B, the first conductive layer 120 is patterned to form a patterned first conductive layer 120'. In some embodiments, the first conductive layer 120 is patterned by dry etching. Because the resist 130 includes the resists 130a and the resists 130b having different thicknesses from the resists 130a, the patterned first conductive layer 120' also includes conductive pillars 120a and conductive wires 120b having different thicknesses from the conductive pillars 120a. Because the resists 130a are thicker than the resists 130b, the conductive pillars 120a are thicker than the conductive wires 120b.

Figure 1C:
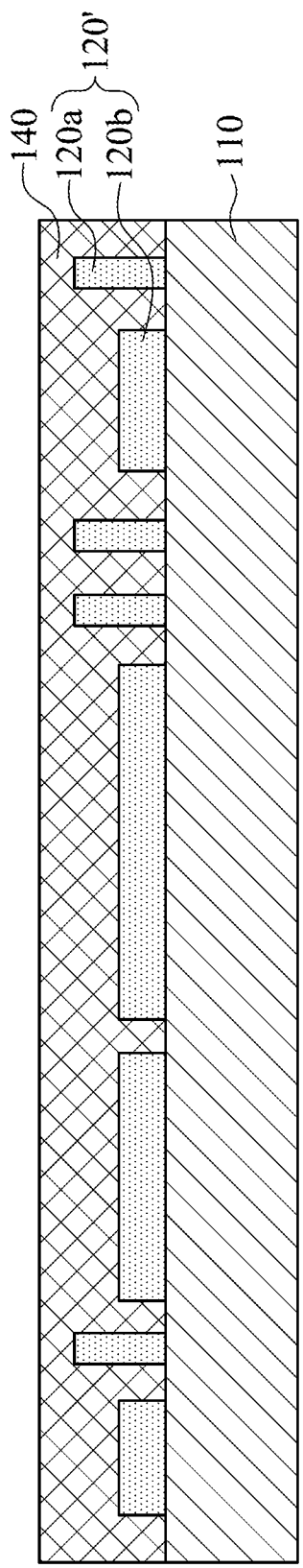

Please refer to FIG. 1C. A second liquid crystal polymer layer 140 including a soluble liquid crystal polymer is formed to cover the first liquid crystal polymer layer 110, the conductive pillars 120a, and the conductive wires 120b. In some embodiments, forming the second liquid crystal polymer layer 140 includes the following operation: coating a mixture including the soluble liquid crystal polymer and a solvent on the first liquid crystal polymer layer 110, the conductive pillars 120a, and the conductive wires 120b; removing the solvent to form the second liquid crystal polymer layer 140.

The soluble liquid crystal polymer includes a repeating unit represented by a formula shown below:

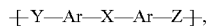

─[─Y─Ar─X─Ar─Z─]─, wherein Ar may be 1,4-phenylene, 1,3-phenylene, 2,6-naphthalene, or 4,4'-biphenylene; Y may be —O—, or —NH—; Z may be —C=O—; X may be amino group, carboxamido group, imido/imino group, amidino group, aminocarbonylamino group, aminothiocarbonyl group, aminocarbonyloxy group, aminosulfonyl group, aminosulfonyloxy group, aminosulfonylamino group, carboxyl ester group, (carboxyl ester)amino group, (alkoxycarbonyl)oxy group, alkoxycarbonyl group, hydroxyamino group, alkoxyamino group, cyanato group, isocyanato group, or a combination thereof, but not limited thereto.

In some embodiments, the soluble liquid crystal polyester is a liquid crystal aromatic polyester. Therefore, a mixture including the liquid crystal aromatic polyester and a solvent can be called a liquid crystal aromatic polyester solution. The liquid crystal aromatic polyester has a good solubility in the solvent. The weight percentage of the liquid crystal aromatic polyester ranges from about 1 wt % to about 85 wt %, for example, 5 wt %, 15 wt %, 25 wt %, 35 wt %, 45 wt %, 55 wt %, 65 wt %, or 75 wt %. When the weight percentage of the liquid crystal aromatic polyester is less than 1 wt %, it is necessary to perform a plurality of coating processes to make the second liquid crystal polymer layer 140 have the required thickness. That is relatively costly and time consuming. However, when the weight percentage of the liquid crystal aromatic polyester is greater than 85 wt %, the liquid crystal aromatic polyester is not easily dissolved in the solvent, thereby generating gelatinization.

For example, the solvent of the liquid crystal aromatic polyester solution may be selected from the group consisting of N-methyl-2-pyrrolidone, N,N-dimethylacetamide, γ-butyrolactone, dimethylformamide, 2-butoxyethanol, and 2-ethoxyethanol.

In some embodiments, the liquid crystal aromatic polyester solution further includes one or more additives to modify the property of subsequently formed liquid crystal polymer layer. In some embodiments, the additives include a stabilizer, a lubricant, a filler, a colorant, a hardener, a plasticizer, and/or an antioxidant, but not limited thereto. For example, the additives may include a surface-treated polytetrafluoroethylene (PTFE) to promote the electrical property of subsequently formed liquid crystal polymer layer and lower the dielectric constant (Dk) and dissipation factor (Df) of the layer. For example, the additives may include inorganic fillers selected from the group consisting of silicon dioxide ($SiO_2$), aluminum hydroxide ($Al(OH)_3$), calcium carbonate ($CaCO_3$), titanium dioxide ($TiO_2$), aluminium oxide ($Al_2O_3$), aluminum nitride (AlN), boron nitride (BN), and a combination thereof; high dielectric constant fillers such as barium titanate and strontium titanate; whiskers such as potassium titanate and aluminum borate; organic fillers such as cured epoxy resins, cross-linked benzo-carnosine resins, and cross-linked acrylic polymers; silane coupling agents; antioxidants; and UV absorbers, but not limited thereto.

In other embodiment, the mixture including the soluble aromatic liquid crystal polymer and the solvent further includes an aromatic polymer. The liquid crystal aromatic polymer is selected one or more from aromatic polyester, aromatic polyamide, polyphenylene terephthalamide (PPTA), poly(p-phenylene-2,6-benzobisoxazole (PBO), and poly(p-hydroxybenzoic acid-co-2-hydroxy-6-naphthoic acid).

Figure 1D:
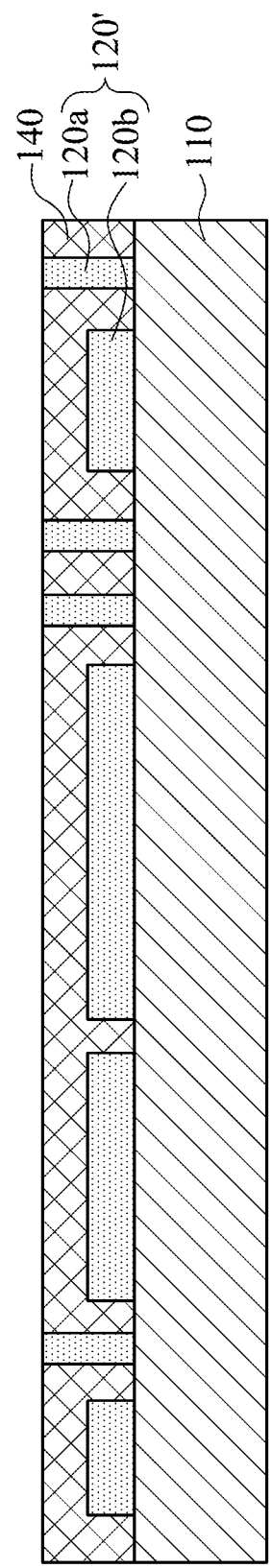

Please refer to FIG. 1D. The second liquid crystal polymer layer 140 which is on the patterned first conductive layer 120' is removed to expose the conductive pillars 120a of the patterned first conductive layer 120'. For example, the second liquid crystal polymer layer 140 is removed by polishing.

Figure 1E:
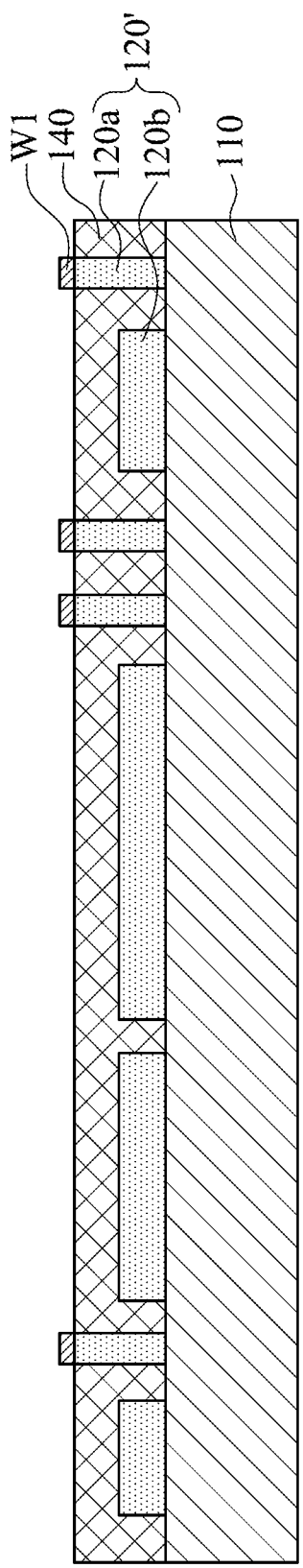

Please refer to FIG. 1E. Bonding structures W1 are formed on and in direct contact with the conductive pillars 120a of the patterned first conductive layer 120'. In some embodiments, the bonding structures W1 are formed by the following operations. A bonding layer is formed on the second liquid crystal polymer layer 140 and the patterned first conductive layer 120'. Subsequently, the bonding layer is patterned to form the bonding structures W1. In some other embodiments, the bonding structures W1 are omitted. In some embodiments, a material of the bonding layer includes a solder or an anisotropic conductive material, and therefore a material of the bonding structures W1 includes the solder or the anisotropic conductive material. In some embodiments, the bonding layer is a welding layer or an anisotropic conductive film (ACF). In some embodiments, the material of the bonding structures W1 includes one kind of metal or metal alloy. For example, the material of the bonding structures W1 is one kind of metal or metal alloy that can form an alloy with copper, such as tin or tin-lead. In some embodiments, the bonding structures W1 are solder balls.

Figure 1F:
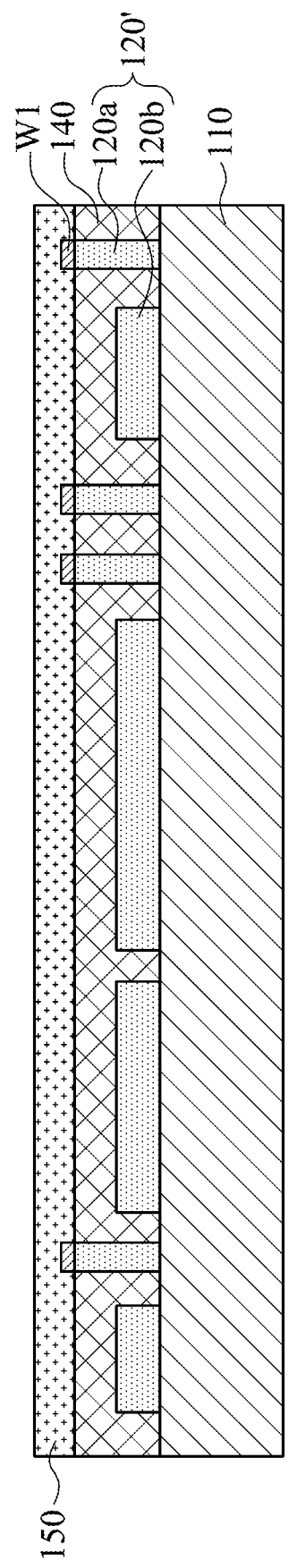

Please refer to FIG. 1F. A second conductive layer 150 is formed on the second liquid crystal polymer layer 140 and the bonding structures W1. The bonding structures W1 can make the second conductive layer 150 adhere closely to the conductive pillars 120a. In some embodiments, a portion of the material of the bonding structures W1 and the material of the second conductive layer 150 form an alloy. In some embodiments, a material of the second conductive layer 150 includes copper, aluminum, iron, silver, palladium, nickel, chromium, molybdenum, tungsten, zinc, manganese, cobalt, gold, tin, lead, stainless steel, or an alloy of the above metals. For example, the second conductive layer 150 may be a metal foil, such as copper foil, aluminum foil, silver foil, tin foil or/and gold foil.

Figure 1G:
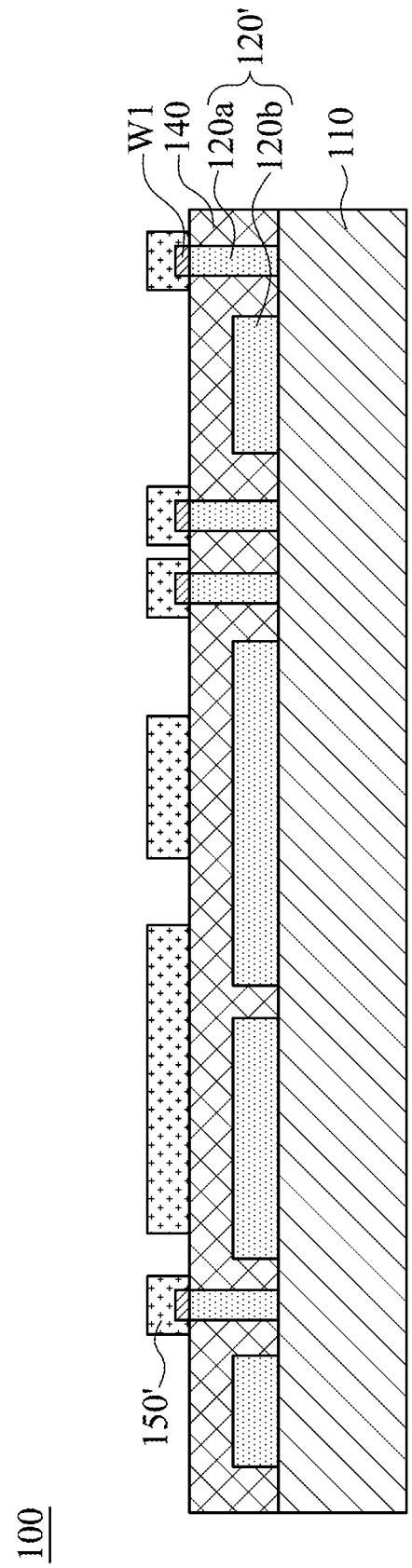

Please refer to FIG. 1G. The second conductive layer 150 is patterned to form a patterned second conductive layer 150'. The structure shown in FIG. 1G is a composite substrate 100. In some embodiments, the patterned second conductive layer 150' includes conductive pillars and conductive wires. The conductive pillars are thicker than the conductive wires (not shown). According to the operations shown in FIGS. 1B-1G, a layered structure similar to that including the conductive pillars 120a, the conductive wires 120b, the second liquid crystal polymer layer 140, the patterned second conductive layer 150', and the bonding structures W1 shown in FIG. 1G, can be formed on the patterned first conductive layer 120' and the second liquid crystal polymer layer 140 shown in FIG. 1G. If the operations shown in FIGS. 1B-1G are performed repeatedly, the layered structures can be formed on the patterned first conductive layer 120' and the second liquid crystal polymer layer 140.

It is noted that, in the present disclosure, during the operation of forming the conductive pillars 120a, which electrically connect with the second conductive layer 150, in the second liquid crystal polymer layer 140, it is not necessary any operation to drill holes and fill the holes with conductive materials. Therefore, the manufacturing method of the composite substrate 100 of the present disclosure is relatively simple, and the required design can be satisfied by easily adjusting the quantity, density, and distribution of the conductive pillars 120a.

The present disclosure provides another manufacturing method of a composite substrate. FIGS. 2A-2F are cross-sectional views of a composite substrate at various stages of fabrication according to one embodiment of the present disclosure.

Figure 2A:
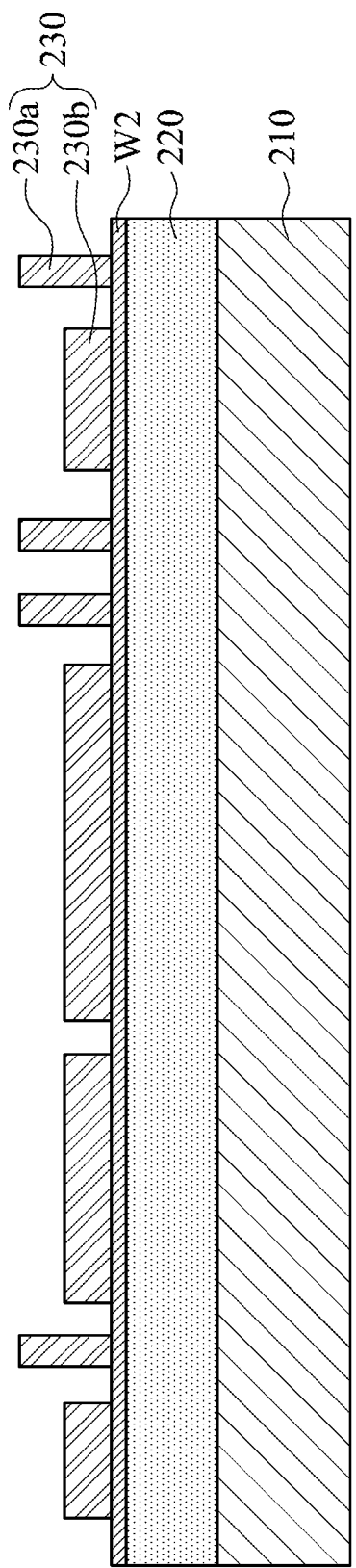
FIGS. 2A-2F are cross-sectional views of a composite substrate at various stages of fabrication according to one embodiment of the present disclosure.

Please refer to FIG. 2A. A first conductive layer 220 and a bonding layer W2 are formed on a first liquid crystal polymer layer 210. Subsequently, a resist 230 is formed on the bonding layer W2. In some embodiments, the first conductive layer 220 is formed on the first liquid crystal polymer layer 210. Next, the bonding layer W2 is formed on the first conductive layer 220. Subsequently, the resist 230 is formed on the bonding layer W2. In some other embodiments, the bonding layer W2 is formed on the first conductive layer 220 in advance, and the first conductive layer 220 covered with the bonding layer W2 is formed on the first liquid crystal polymer layer 210. Subsequently, the resist 230 is formed on the bonding layer W2. In some other embodiments, the bonding layer W2 is omitted. In some embodiments, a material of the bonding layer W2 includes a solder or an anisotropic conductive material. In some embodiments, the bonding layer W2 is a welding layer or an anisotropic conductive film. In some embodiments, the material of the bonding layer W2 is one kind of metal or metal alloy that can form an alloy with copper, such as tin or tin-lead.

Figure 2B:
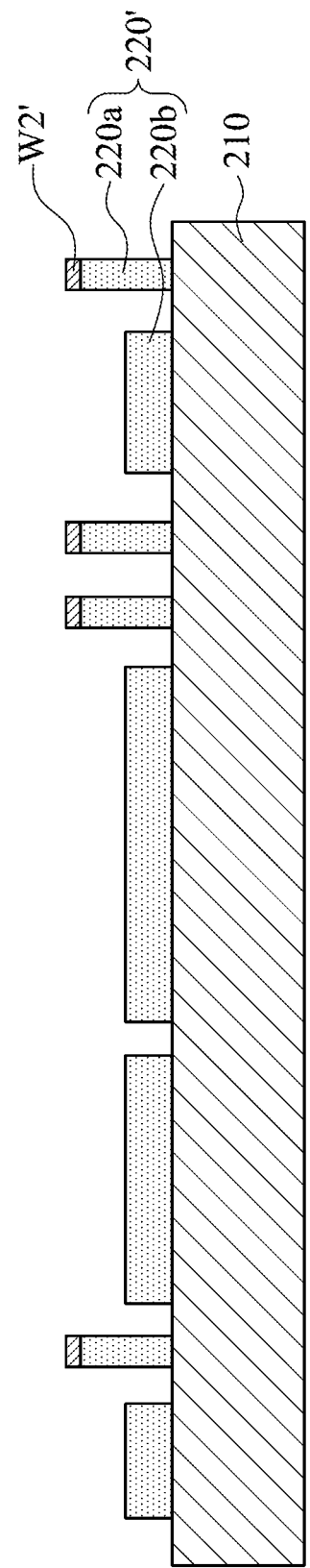

Please refer to FIG. 2B. The first conductive layer 220 and the bonding layer W2 are patterned to form a patterned first conductive layer 220' and a patterned bonding layer W2', which is on the conductive pillars 220a of the patterned first conductive layer 220'. In some embodiments, the first conductive layer 220 and the bonding layer W2 are patterned by etching. Because the resist 230 includes the resists 230a and the resists 230b having different thicknesses from the resists 230a, the patterned first conductive layer 220' also includes conductive pillars 220a and conductive wires 220b having different thicknesses from the conductive pillars 220a. Because the resists 230a are thicker than the resists 230b, the conductive pillars 220a are thicker than the conductive wires 220b.

Figure 2C:
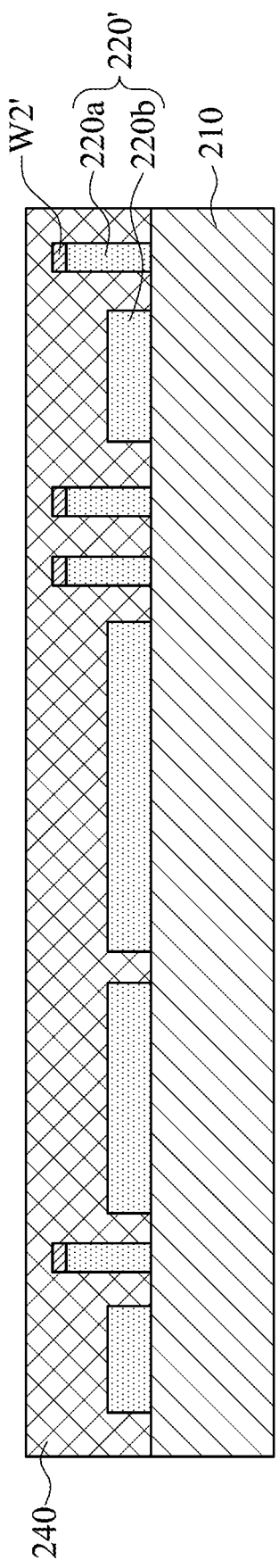

Please refer to FIG. 2C. A second liquid crystal polymer layer 240 including a soluble liquid crystal polymer is formed on the first liquid crystal polymer layer 210, the conductive pillars 220a, the conductive wires 220b, and the patterned bonding layer W2'. The examples and embodiments of the second liquid crystal polymer layer 240 can be the same with or similar to the previous descriptions regarding to the second liquid crystal polymer layer 140.

Figure 2D:
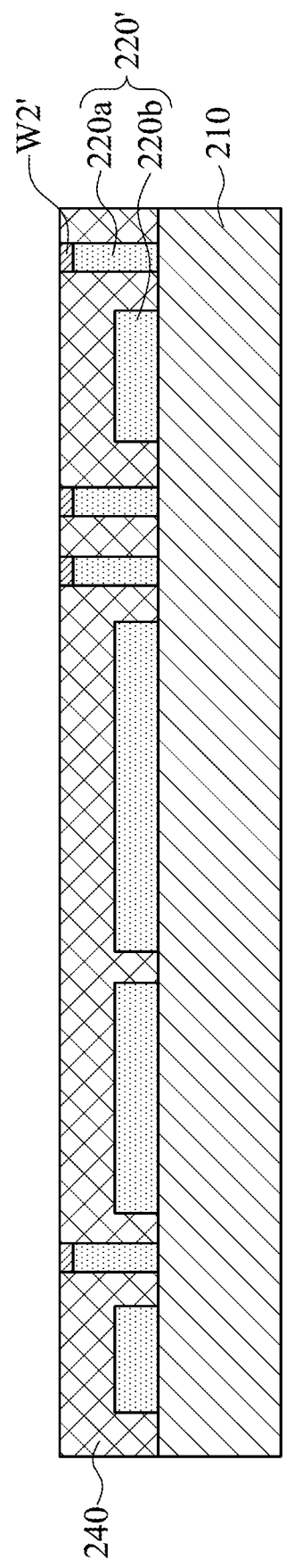

Please refer to FIG. 2D. The second liquid crystal polymer layer 240 which is on the patterned first conductive layer 220' is removed to expose the patterned bonding layer W2'.

Figure 2E:
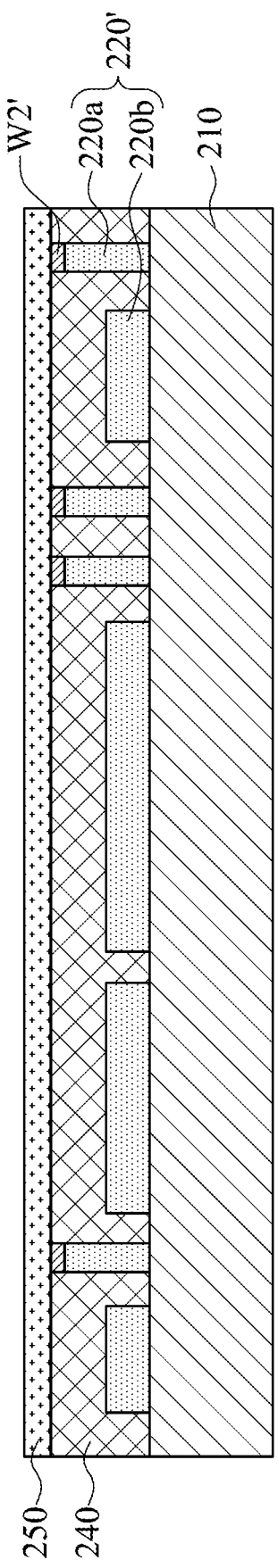

Please refer to FIG. 2E. A second conductive layer 250 is formed on the second liquid crystal polymer layer 240 and the patterned bonding layer W2'. The patterned bonding layer W2' can make the second conductive layer 250 adhere closely to the conductive pillars 220a. In other embodiment, a portion of the material of the patterned bonding layer W2' and the material of the second conductive layer 250 form an alloy. In some embodiments, a material of the second conductive layer 250 includes copper, aluminum, iron, silver, palladium, nickel, chromium, molybdenum, tungsten, zinc, manganese, cobalt, gold, tin, lead, stainless steel, or an alloy of the above metals. For example, the second conductive layer 250 may be a metal foil, such as copper foil, aluminum foil, silver foil, tin foil or/and gold foil.

Figure 2F:
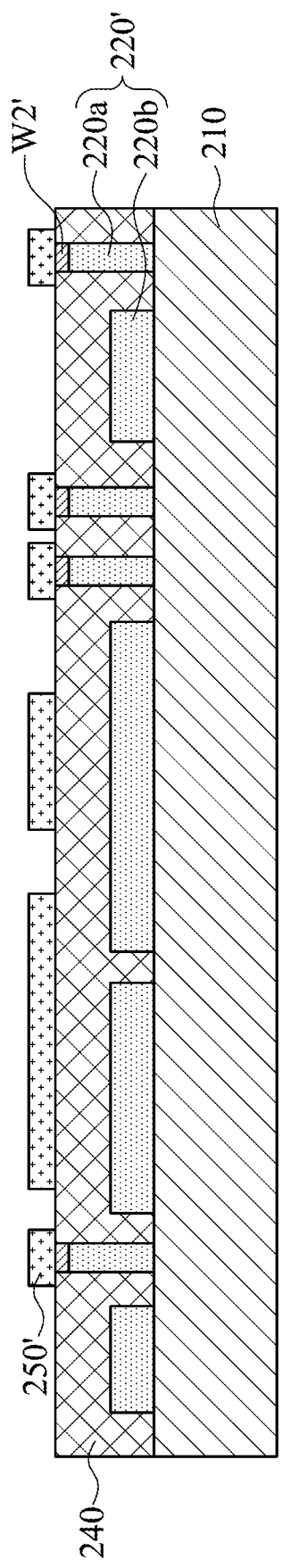

Please refer to FIG. 2F. The second conductive layer 250 is patterned to form a patterned second conductive layer 250'. The structure shown in FIG. 2F is a composite substrate 200.

In some embodiments, according to the operations shown in FIGS. 2A-2E, a layered structure similar to that including the conductive pillars 220a, the conductive wires 220b, the second liquid crystal polymer layer 240, the second conductive layer 250, and the patterned bonding layer W2' shown in FIG. 2E, can be formed on the patterned first conductive layer 220' and the second liquid crystal polymer layer 240 shown in FIG. 2E. If the operations shown in FIGS. 2A-2E are performed repeatedly, the layered structures can be formed on the patterned first conductive layer 220' and the second liquid crystal polymer layer 240 shown in FIG. 2E.

It is noted that, in the present disclosure, during the operation of forming the conductive pillars 220a, which electrically connect with the second conductive layer 250, in the second liquid crystal polymer layer 240, it is not necessary any operation to drill holes and fill the holes with conductive materials. Therefore, the manufacturing method of the composite substrate 200 of the present disclosure is relatively simple, and the required design can be satisfied by easily adjusting the quantity, density, and distribution of the conductive pillars 220a.

The present disclosure provides another manufacturing method of a composite substrate. FIGS. 3A-3D are cross-sectional views of a composite substrate at various stages of fabrication according to one embodiment of the present disclosure.

Figure 3A:
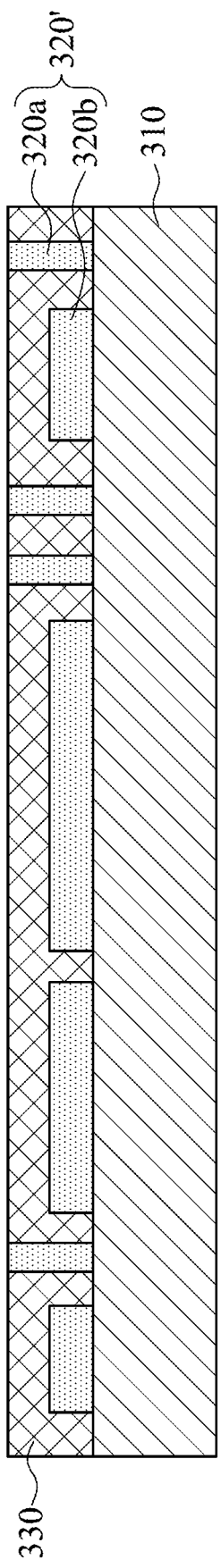
FIGS. 3A-3D are cross-sectional views of a composite substrate at various stages of fabrication according to one embodiment of the present disclosure.

Please refer to FIG. 3A. A first liquid crystal polymer layer 310, a patterned conductive layer 320', and a second liquid crystal polymer layer 330 are received. The patterned conductive layer 320' includes conductive pillars 320a and conductive wires 320b. The examples and embodiments of the first liquid crystal polymer layer 310, the conductive pillars 320a, the conductive wires 320b, and the second liquid crystal polymer layer 330 can be the same with or similar to the previous descriptions regarding to the first liquid crystal polymer layer 110, the conductive pillars 120a, the conductive wires 120b, and the second liquid crystal polymer layer 140.

Figure 3B:
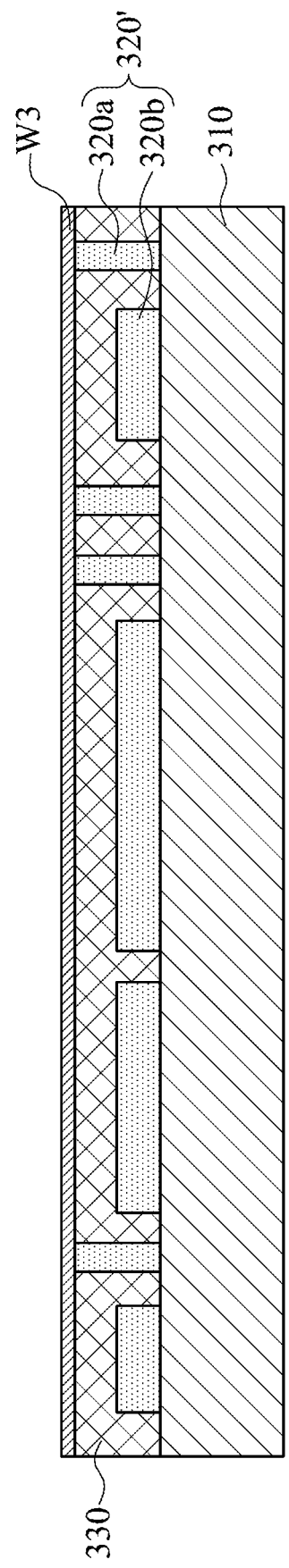

Please refer to FIG. 3B. A bonding layer W3 is formed on the patterned conductive layer 320' and the second liquid crystal polymer layer 330. In some other embodiments, the bonding layer W3 is omitted. In some embodiments, a material of the bonding layer W3 includes a solder or an anisotropic conductive material. In some embodiments, the bonding layer W3 is a welding layer or an anisotropic conductive film. In some embodiments, the material of the bonding layer W3 is one kind of metal or metal alloy that can form an alloy with copper, such as tin or tin-lead.

Figure 3C:
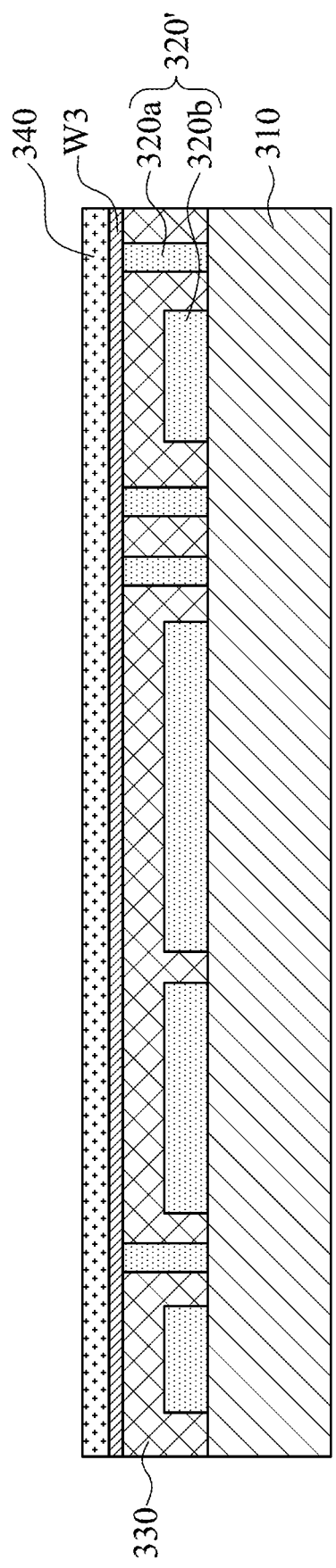

Please refer to FIG. 3C. A second conductive layer 340 is formed on the bonding layer W3. The bonding layer W3 can make the second conductive layer 340 adhere closely to the conductive pillars 320a. In other embodiment, a portion of the material of the bonding layer W3 and the material of the second conductive layer 340 form an alloy. In some embodiments, a material of the second conductive layer 340 includes copper, aluminum, iron, silver, palladium, nickel, chromium, molybdenum, tungsten, zinc, manganese, cobalt, gold, tin, lead, stainless steel, or an alloy of the above metals. For example, the second conductive layer 340 may be a metal foil, such as copper foil, aluminum foil, silver foil, tin foil or/and gold foil.

Figure 3D:
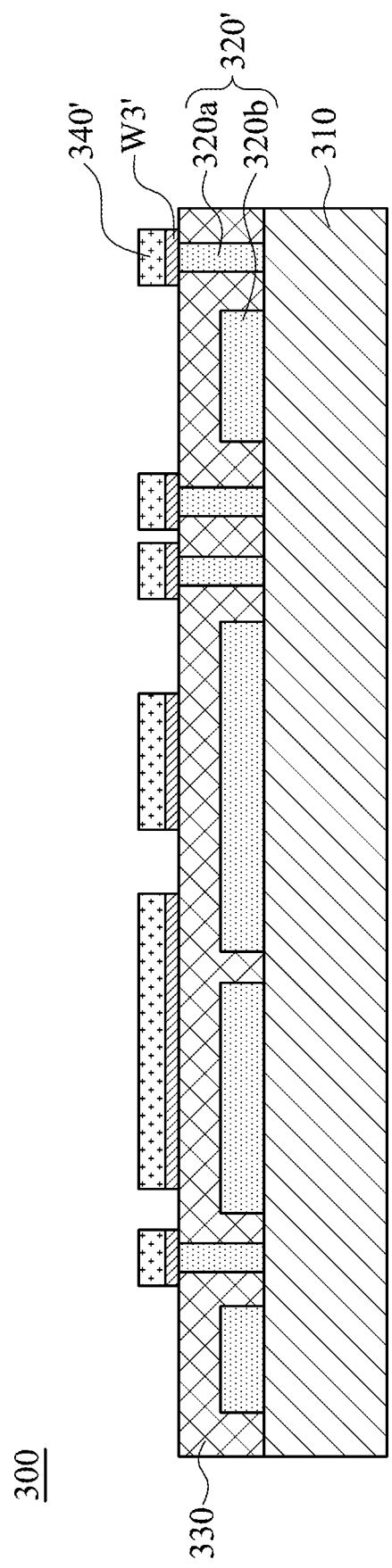

Please refer to FIG. 3D. The second conductive layer 340 and the bonding layer W3 are patterned to form a patterned second conductive layer 340' and a patterned bonding layer W3'. The structure shown in FIG. 3D is a composite substrate 300. In some embodiments, the second conductive layer 340 and the bonding layer W3 are patterned by etching. In some embodiments, the patterned second conductive layer 340' and the patterned bonding layer W3' include conductive pillars and conductive wires. The conductive pillars are thicker than the conductive wires (not shown). According to the operations shown in FIGS. 3A-3D, a layered structure similar to that including the conductive pillars 320a, the conductive wires 320b, the second liquid crystal polymer layer 330, the patterned second conductive layer 340', and the patterned bonding layer W3' shown in FIG. 3D, can be formed on the patterned conductive layer 320' and the second liquid crystal polymer layer 330. If the operations shown in FIGS. 3A-3D are performed repeatedly, the layered structures can be formed on the patterned conductive layer 320' and the second liquid crystal polymer layer 330.

It is noted that, in the present disclosure, during the operation of forming the conductive pillars 320a, which electrically connect with the second conductive layer 340, in the second liquid crystal polymer layer 330, it is not necessary any operation to drill holes and fill the holes with conductive materials. Therefore, the manufacturing method of the composite substrate 300 of the present disclosure is relatively simple, and the required design can be satisfied by easily adjusting the quantity, density, and distribution of the conductive pillars 320a.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A manufacturing method of a composite substrate, comprising:
   forming a first conductive layer on a first liquid crystal polymer layer;
   patterning the first conductive layer to form a patterned first conductive layer;
   forming a second liquid crystal polymer layer comprising a soluble liquid crystal polymer to cover the patterned first conductive layer; and
   removing the second liquid crystal polymer layer which is on the patterned first conductive layer.

2. The manufacturing method of claim 1, wherein forming the second liquid crystal polymer layer to cover the patterned first conductive layer comprises:
   coating a mixture comprising the soluble liquid crystal polymer and a solvent on the first liquid crystal polymer layer; and
   removing the solvent to form the second liquid crystal polymer layer.

3. The manufacturing method of claim 1, wherein the soluble liquid crystal polymer comprises a repeating unit represented by a formula shown below:

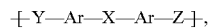

wherein Ar is 1,4-phenylene, 1,3-phenylene, 2,6-naphthalene, or 4,4'-biphenylene; Y is —O— or —NH—; Z is —C=O—; and X is amino group, carboxamido group, imido/imino group, amidino group, aminocarbonylamino group, aminothiocarbonyl group, aminocarbonyloxy group, aminosulfonyl group, aminosulfonyloxy group, aminosulfonylamino group, carboxyl ester group, (carboxyl ester) amino group, (alkoxycarbonyl)oxy group, alkoxycarbonyl group, hydroxyamino group, alkoxyamino group, cyanato group, isocyanato group, or a combination thereof.

4. The manufacturing method of claim 1, wherein the soluble liquid crystal polymer is a liquid crystal aromatic polyester.

5. The manufacturing method of claim 1, after removing the second liquid crystal polymer layer which is on the patterned first conductive layer, further comprising forming a second conductive layer on the patterned first conductive layer.

6. The manufacturing method of claim 5, before forming the second conductive layer on the patterned first conductive layer, further comprising forming a bonding structure in direct contact with the patterned first conductive layer.

7. The manufacturing method of claim 6, wherein a material of the bonding structure comprises a solder or an anisotropic conductive material.

8. The manufacturing method of claim 1, before patterning the first conductive layer to form the patterned first conductive layer, further comprising forming a bonding layer on the first conductive layer.

9. The manufacturing method of claim 8, wherein a material of the bonding layer comprises a solder or an anisotropic conductive material.

10. The manufacturing method of claim 5, before forming the second conductive layer on the patterned first conductive layer, further comprising forming a bonding layer on the patterned first conductive layer.

11. The manufacturing method of claim 10, after forming the second conductive layer on the patterned first conductive layer, further comprising patterning the second conductive layer and the bonding layer.

12. The manufacturing method of claim 10, wherein a material of the bonding layer comprises a solder or an anisotropic conductive material.

13. The manufacturing method of claim 1, wherein patterning the first conductive layer to form the patterned first conductive layer comprises patterning the first conductive layer to form a conductive wire and a conductive pillar thicker than the conductive wire.

* * * * *